US011099225B2

(12) United States Patent
Escrouzailles et al.

(10) Patent No.: US 11,099,225 B2
(45) Date of Patent: Aug. 24, 2021

(54) METHOD FOR DETERMINING THE OUTPUT VOLTAGE OF A TRANSISTOR

(71) Applicant: Alstom Transport Technologies, Saint-Ouen (FR)

(72) Inventors: Vincent Escrouzailles, Semeac (FR); Michel Piton, Semeac (FR)

(73) Assignee: Alstom Transport Technologies, Saint-Ouen (FR)

( * ) Notice: Subject to any disclaimer, the term of this patent is extended or adjusted under 35 U.S.C. 154(b) by 167 days.

(21) Appl. No.: 15/994,935

(22) Filed: May 31, 2018

(65) Prior Publication Data
US 2018/0348293 A1 Dec. 6, 2018

(30) Foreign Application Priority Data

May 31, 2017 (FR) ...................................... 1754805

(51) Int. Cl.
*G01R 31/26* (2020.01)
*H03K 17/567* (2006.01)

(52) U.S. Cl.
CPC ..... *G01R 31/2617* (2013.01); *G01R 31/2608* (2013.01); *G01R 31/2621* (2013.01); *H03K 17/567* (2013.01)

(58) Field of Classification Search
CPC ................ G01R 31/26; G01R 31/2617; G01R 31/2608; G01R 31/2621; G01R 31/2639; H03K 17/567; G05F 1/561
See application file for complete search history.

(56) References Cited

U.S. PATENT DOCUMENTS

| 2013/0169297 A1* | 7/2013 | Pilz ........................ G01R 27/14 324/713 |
| 2014/0084899 A1* | 3/2014 | Powell ............... G01R 19/0069 323/313 |
| 2016/0191021 A1 | 6/2016 | Zhao et al. |
| 2017/0285095 A1* | 10/2017 | Yanagi ............... G01R 31/2601 |

FOREIGN PATENT DOCUMENTS

| DE | 102015204343 A1 | 9/2016 |
| EP | 2615467 A1 | 7/2013 |

OTHER PUBLICATIONS

Search report for FR1754805 dated Feb. 9, 2018.

* cited by examiner

*Primary Examiner* — Son T Le
(74) *Attorney, Agent, or Firm* — Thompson Coburn LLP; Steven M. Ritchey

(57) ABSTRACT

A method for determining an output voltage of a transistor, the transistor comprising an input electrode, a first output electrode and a second output electrode, the potential of the first output electrode being higher than the potential of the second output electrode the output voltage being the difference in potential between the first output electrode and the second output electrode. The method includes a step for measuring the evolution over time of a control voltage of the transistor, the control voltage being the difference in potential between the input electrode and the second output electrode, and determining the output voltage from the measured control voltage.

8 Claims, 4 Drawing Sheets ically possible combinations:
only the control voltage is measured during the method.

METHOD FOR DETERMINING THE OUTPUT VOLTAGE OF A TRANSISTOR

CROSS-REFERENCES TO RELATED APPLICATIONS

This application claims the benefit of French Patent Application FR 17 54805, filed May 31, 2017, and hereby incorporated by reference herein.

TECHNICAL FIELD OF THE INVENTION

The present invention relates to a method for determining the output voltage of a transistor. The present invention also relates to an associated determining device. The present invention also relates to an energy conversion system comprising such a determining device and, advantageously, a railway traction chain comprising such an energy conversion system.

BACKGROUND OF THE INVENTION

The use of transistors, in particular in the traction chains of railway vehicles, is known. Such transistors are generally used in switching, i.e., said transistors are commanded so as to open and close with a defined frequency.

In general, a transistor comprises an input electrode, also called "base" or "gate", an output electrode, also called "collector" or "drain", and a second output electrode, also called "emitter" or "source".

In order to adapt the switching speed of the transistors, and thus to minimize the losses due to switching, it is known to measure the output voltage between the first and second output electrodes of said transistors.

However, the output voltage of the transistors used in the traction chains is often high. For example, for insulated gate bipolar transistors, said voltage may be equal to up to 4500 Volts. Such a high voltage is then measured with an appropriate measuring chain.

Yet an appropriate measuring chain involves many components to operate, which makes it complex. Furthermore, such a measuring chain is restrictive to implement for each transistor.

There is therefore a need for a device making it possible to determine the output voltage of a transistor that is easier to implement.

SUMMARY OF THE INVENTION

To that end, the invention relates to a method for determining an output voltage of a transistor, the transistor comprising an input electrode, a first output electrode and a second output electrode, the potential of the first output electrode being higher than the potential of the second output electrode, the output voltage being the difference in potential between the first output electrode and the second output electrode, the method comprising a step for measuring the evolution over time of a control voltage of the transistor, the control voltage being the difference in potential between the input electrode and the second output electrode, and a determining step during which the output voltage is determined from the measured control voltage.

According to specific embodiments, the method comprises one or more of the following features, considered alone or according to any technically possible combinations:
only the control voltage is measured during the method.
the transistor comprises two states: a first state in which the transistor is on and a second state in which the transistor is off, the measuring step being carried out while the transistor is in the second state.
the voltage ratio of the transistor is greater than or equal to 50, the voltage ratio being the absolute value of the output voltage of the transistor by the control voltage of said transistor.
the transistor is an insulated gate bipolar or unipolar transistor.
the method further comprises the following steps:
providing a first calibration table prepared from a calibration transistor, the calibration transistor comprising an input electrode, a first output electrode and a second output electrode, the potential of the first output electrode of the calibration transistor being higher than the potential of the second output electrode of said calibration transistor, the first calibration table representing the evolution of the control voltage of the calibration transistor as a function of time for different output voltages of said calibration transistor and, when a current with a same first predetermined profile is applied between the input electrode and the second output electrode of said calibration transistor, the control voltage of the calibration transistor being the difference in potential between the input electrode and the second output electrode of the calibration transistor, the output voltage of the calibration transistor being the difference in potential between the first output electrode and the second output electrode of the calibration transistor,
providing a second calibration table representing the evolution of the output voltage of the calibration transistor as a function of the duration undergoing the control voltage of said calibration transistor to reach a predetermined threshold voltage value from the time where the current having the first predetermined profile is applied between the input electrode and the second output electrode of the calibration transistor,
applying a current having the first predetermined profile between the input electrode and the second output electrode of the transistor,
the measuring step being carried out at the same time as the application step,
the determining step comprising determining, from the first calibration table and the measured control voltage of the transistor, the duration undergoing the control voltage of the transistor to reach the predetermined threshold voltage value,
the determining step further comprising determining, from the determined duration and the second calibration table, the output voltage of the transistor.
the transistor comprises two states: a first state in which the transistor is on and a second state in which the transistor is off, the method comprising a step for placing the transistor in the second state, with a setpoint determined based on the determined output voltage of said transistor.
the method comprises a step for providing a third calibration table, the third calibration table associating a second control current profile for each output voltage value of the calibration transistor, the step for placement in the second state further comprising the selection of one of the second control current profiles as a function of the determined output voltage of the transistor and of the third calibration table, and for applying a control current having the second selected profile between the input electrode and the second output electrode of the transistor, the second selected current profile being able to place the transistor in the second state.

The invention also relates to a device for determining an output voltage of a transistor, the transistor comprising an input electrode, a first output electrode and a second output electrode, the potential of the first output electrode being higher than the potential of the second output electrode, the output voltage being the difference in potential between the first output electrode and the second output electrode, the device comprising a unit for measuring the evolution over time of a control voltage of the transistor, the control voltage being the difference in potential between the input electrode and the second output electrode, and a processing unit able to determine the output voltage from the measured control voltage.

The invention also relates to an energy conversion system comprising at least one transistor and a device as previously described associated with said transistor.

BRIEF DESCRIPTION OF THE DRAWINGS

Other features and advantages of the invention will appear upon reading the following description of embodiments of the invention, solely as an example and done in reference to the drawings, which are.

DETAILED DESCRIPTION OF SOME EMBODIMENTS

Figure 1:
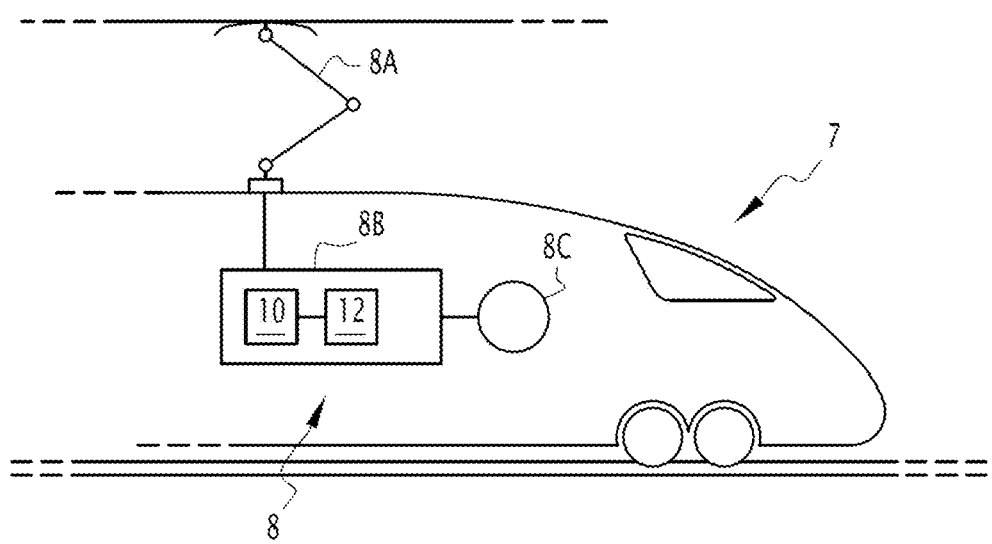
FIG. 1, a schematic illustration of a railway vehicle comprising a traction chain comprising an energy conversion system, the conversion system comprising a transistor and a determining device according to the invention, FIG. 2, a schematic illustration of a transistor and a device for determining the output voltage of said transistor, FIG. 3, a schematic illustration of a first calibration table, FIG. 4, a schematic illustration of a first control current profile and the control voltage of the transistor resulting therefrom, FIG. 5, a schematic illustration of a second calibration table, FIG. 6, a schematic illustration of a second control current profile and the control voltage of the transistor resulting therefrom, and FIG. 7, a flow diagram illustration of steps of a method according to the invention.

A railway vehicle 7 is illustrated in FIG. 1. The railway vehicle 7 is for example a train or tram.

The railway vehicle 7 comprises a traction chain 8. In the example illustrated in FIG. 1, the traction chain 8 comprises a pantograph 8A, an energy conversion system 8B and a motor 8C.

Figure 2:
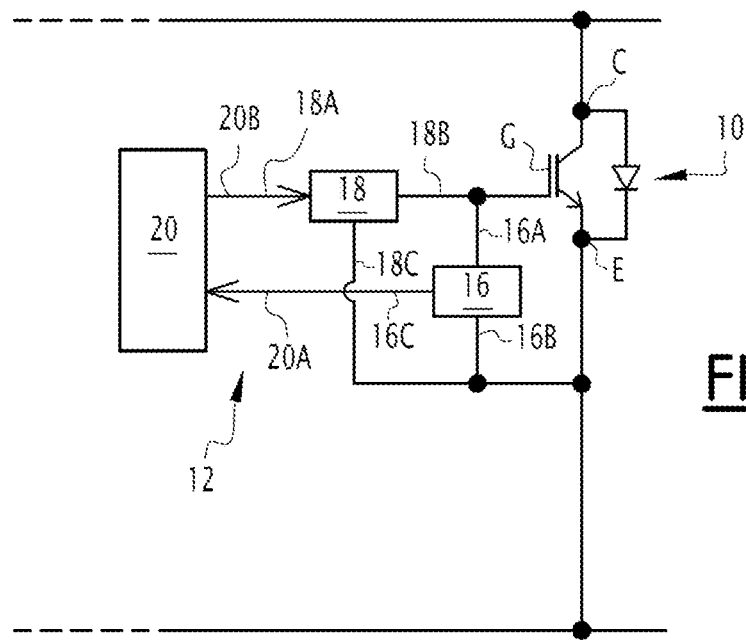

The conversion system 8B comprises at least one transistor 10 and a determining device 12 that are illustrated in more detail in FIG. 2.

As illustrated in FIG. 2, the transistor 10 comprises an input electrode G, a first output electrode C and a second output electrode E. The potential of the first output electrode C is higher than the potential of the second output electrode E of the transistor 10.

The transistor 10 comprises an output voltage $V_{CE}$ defined as being the difference in potential between the first output electrode C and the second output electrode E. The transistor 10 also comprises a control voltage $V_{GE}$ defined as being the difference in potential between the input electrode G and the second output electrode E.

The transistor 10 is for example a bipolar transistor, such as an insulated-gate bipolar transistor (IGBT). Alternatively, the transistor 10 is an insulated gate unipolar transistor.

When the transistor 10 is an insulated gate bipolar or unipolar transistor, the input electrode G corresponds to the base of the transistor 10, the first output electrode C corresponds to the collector of the transistor 10 and the second output electrode E corresponds to the emitter of the transistor 10.

In one alternative, the transistor 10 is a metal oxide semiconductor field effect transistor (MOSFET).

When the transistor 10 is a MOSFET transistor, the input electrode G corresponds to the gate of the transistor 10, the first output electrode C corresponds to the drain of the transistor 10 and the second output electrode E corresponds to the source of the transistor 10.

Advantageously, the voltage ratio of the transistor 10 is greater than or equal to 50. The voltage ratio of the transistor 10 is defined as the absolute value of the ratio between the output voltage $V_{CE}$ of the transistor 10 and the control voltage $V_{GE}$ of said transistor 10.

More particularly, the output voltage $V_{CE}$ of the transistor 10 is for example greater than or equal to 1000 Volts and the control voltage $V_{GE}$ of the transistor 10 is for example comprised between −15 Volts and +15 Volts.

The transistor 10 comprises two states: a first state in which the transistor 10 is on and a second state in which the transistor 10 is off. The term "on" means that the transistor 10 behaves like a conductive material. The term "off" means that the transistor 10 behaves like a non-conductive material.

The transistor 10 is able to go from the second state to the first state when a threshold voltage is reached between the input electrode G and the second output electrode E. The threshold voltage is for example greater than or equal to 5 Volts.

In the rest of the description, the transistor 10 is a transistor to be characterized, i.e., a transistor for which one wishes to determine the output voltage $V_{CE}$.

The determining device 12 is able to carry out a method for determining the output voltage $V_{CE}$ of the transistor 10 that will be described in more detail in the rest of the description.

The device 12 comprises a measuring unit 16, a current injector 18 and a data processing unit 20.

The measuring unit 16 is able to measure the control voltage $V_{GE}$ of the transistor 10.

In the example illustrated in FIG. 2, the measuring unit 16 comprises two input terminals 16A, 16B and an output terminal 16C. The first input terminal 16A is connected to the input electrode G of the transistor 10. The second input terminal 16B is connected to the second electrode E of the transistor 10. The output terminal 16C is connected to the processing unit 20, as will be described later.

The measuring unit 16 is for example a voltmeter.

The current injector 18 is able to inject a current between the input electrode G and the second output electrode E of the transistor 10.

In the example illustrated in FIG. 2, the current injector 18 comprises one input terminal 18A and two output terminals 18B, 18C. The input terminal 18A is connected to the processing unit 20, as will be described hereinafter. The first output terminal 18B is connected to the input electrode G of the transistor 10. The second output terminal 18C is connected to the second electrode E of the transistor 10.

The current injector 18 is preferably a current source. The term "current source" refers to a device in one block able to produce a constant electric current.

Alternatively, the current injector 18 is a device in several blocks comprising, for example, a bridge of resistances connected to a voltage source.

The processing unit 20 is able to determine the output voltage $V_{CE}$ of the transistor 10. The processing unit 20 is also able to command the injection of a current by the current injector 18.

In the example illustrated in FIG. 2, the processing unit 20 comprises an input terminal 20A and an output terminal 20B. The input terminal 20A is connected to the output terminal 16C of the measuring unit 16. The output terminal 20B is connected to the input terminal 18A of the current injector 18.

The processing unit 20 preferably comprises a memory and a processor.

The processing unit 20 is for example a programmable logic circuit such as an FPGA (Field-Programmable Gate Array).

Figure 7:
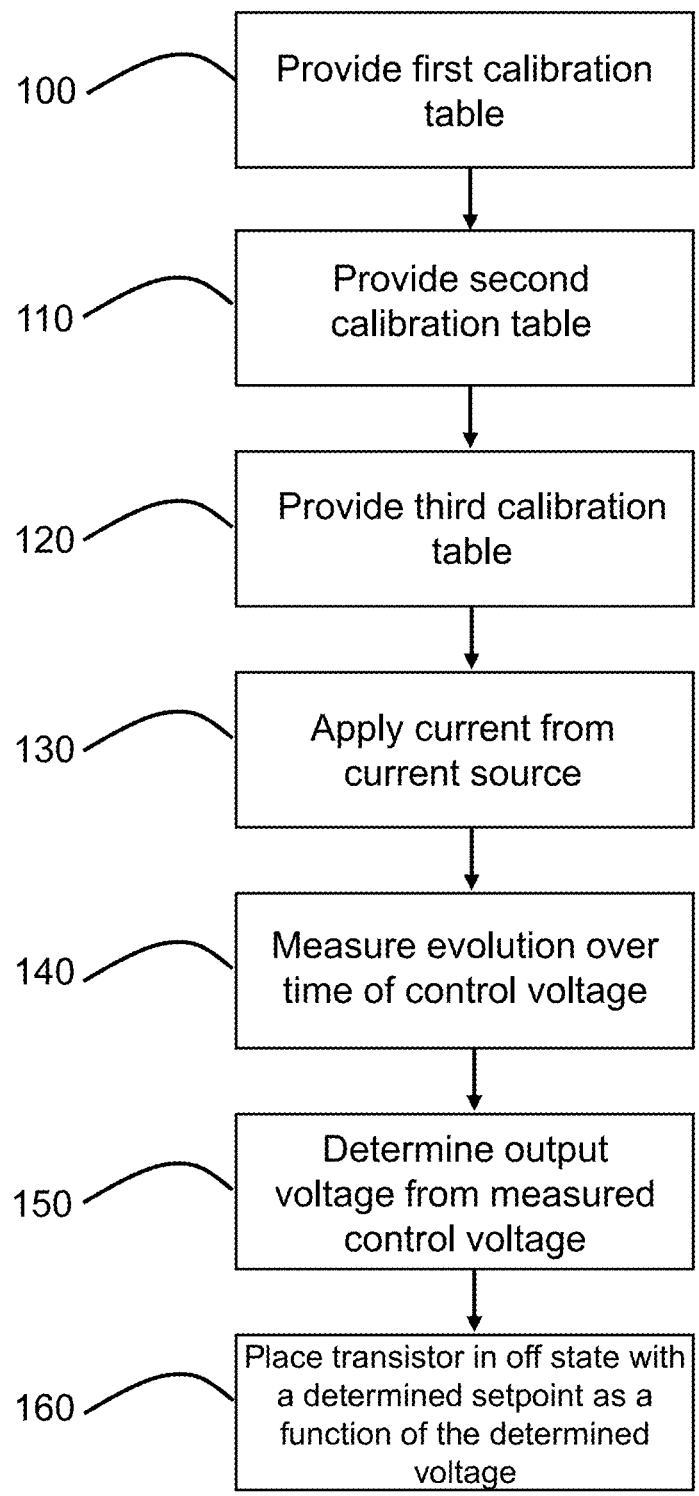

A method for determining the output voltage VCE of the transistor 10, from the determining device 12, will now be described, and is illustrated in FIG. 7.

The determining method comprises a step 100 for providing a first calibration table established from a calibration transistor.

The calibration transistor comprises an input electrode, a first output electrode and a second output electrode. The potential of the first output electrode of the calibration transistor is higher than the potential of the second output electrode of said calibration transistor.

The first calibration table may be presented in different forms. For example, the first calibration table is a graph or table.

Figure 3:
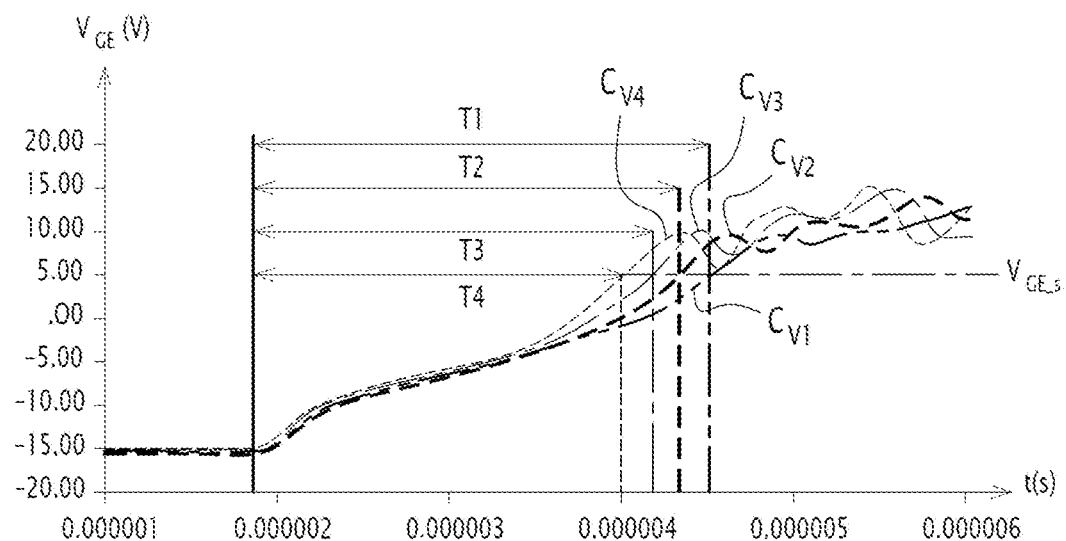

An example first calibration table is illustrated in FIG. 3. The first calibration table illustrated in FIG. 3 comprises curves. Each curve represents the evolution of the control voltage $V_{GE}$ of the calibration transistor 10 as a function of time for a given output voltage $V_{CE}$ of said calibration transistor. In particular, each of the curves $C_{V1}$, $C_{V2}$, $C_{V3}$, $C_{V4}$ of FIG. 3 was obtained for an output voltage $V_{CE}$ of the calibration transistor respectively equal to 1000 Volts, 2500 Volts, 3600 Volts and 4500 Volts.

Furthermore, each curve of FIG. 3 was established simultaneously with the application of a control current having a first predetermined profile between the input electrode and the second output electrode of said calibration transistor.

The first profile corresponds to the on state of the transistor.

The control current having the first profile is chosen such that the control voltage $V_{GE}$ of the calibration transistor increases quickly so as to facilitate the measurement of the control voltage $V_{GE}$, and therefore the obtainment of the first calibration curve. For example, as illustrated in FIG. 3, the first profile is chosen such that the control voltage $V_{GE}$ of the calibration transistor, which starts from −15 Volts, reaches values that may go up to +15 Volts.

Figure 4:
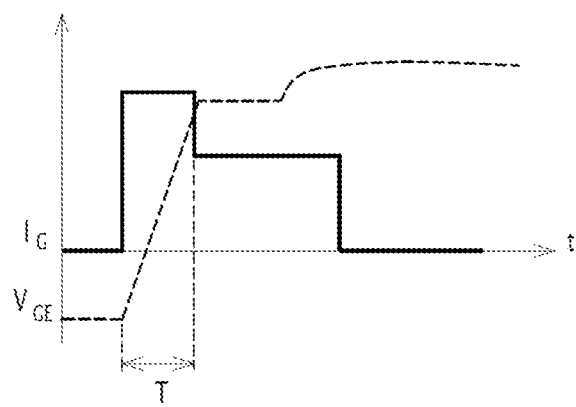

One example of the first profile is illustrated in FIG. 4. As shown in this FIG. 4, the first profile has different plateaus. Each plateau corresponds to a constant value of the current. The plateau with the highest value is the first plateau, i.e., the plateau applied at the beginning of the injection of the current.

Preferably, the value of the current according to the first profile at the highest plateau is greater than or equal to 200 milliamperes.

The processing method also comprises a step 110 for providing a second calibration table.

The second calibration table may be presented in different forms. For example, the second calibration table is a graph or table.

Figure 5:
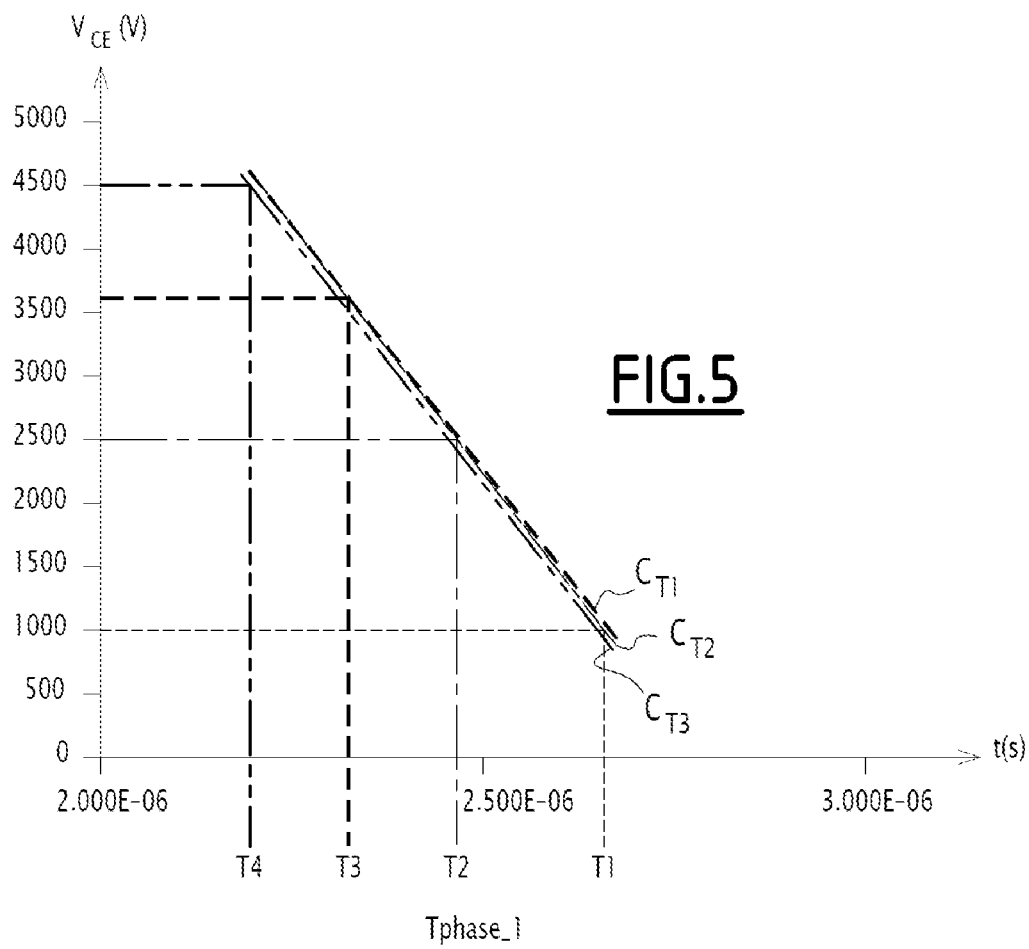

An example second calibration table is illustrated in FIG. 5. The second calibration table of FIG. 5 shows the evolution of the output voltage $V_{CE}$ of the calibration transistor as a function of a duration T. The duration T is the duration undergoing the control voltage $V_{GE}$ of the calibration transistor to reach a predetermined threshold voltage value $V_{GE\_S}$ from the time where the current having the first predetermined profile is applied between the input electrode and the second output electrode of said calibration transistor.

The predetermined threshold voltage value $V_{GE\_S}$ is for example chosen experimentally. For the first and second calibration tables illustrated in FIGS. 3 and 5, the predetermined threshold voltage value $V_{GE\_S}$ is set at 5 Volts.

In the embodiment illustrated in FIGS. 3 and 5, the second calibration table of FIG. 5 is obtained from the first calibration table of FIG. 3. Indeed, the first calibration table makes it possible to obtain the durations T, each associated with an output voltage $V_{CE}$. According to one example, the durations T1, T2, T3, T4 respectively obtained for each of the curves $C_{V1}$, $C_{V2}$, $C_{V3}$, $C_{V4}$ are illustrated schematically in FIG. 3.

The second calibration table of FIG. 5 comprises three curves $C_{T1}$, $C_{T2}$, $C_{T3}$ each obtained for a temperature respectively equal to 25 degrees Celsius (° C.), 80° C. and 125° C.

From these three curves $C_{T1}$, $C_{T2}$, $C_{T3}$, a linear relationship is observed between the output voltage $V_{CE}$ of the calibration transistor and the duration T. Thus, knowing the duration T, the second calibration curve makes it possible to rise directly to the output voltage $V_{CE}$.

Furthermore, the three curves $C_{T1}$, $C_{T2}$, $C_{T3}$ being superimposed, this makes it possible to deduce therefrom that the relationship between the output voltage $V_{CE}$ and the duration T is independent of the temperature of the transistor of interest.

The method also comprises a step 120 for providing a third calibration table.

The third calibration table may be presented in different forms. For example, the third calibration table is a table.

The third calibration table associates a second respective control current profile for each value of the output voltage $V_{CE}$ of the calibration transistor.

The method also comprises a step 130 for the application, by the current injector 18, of a current having the first predetermined profile between the input electrode G and the second output electrode E of the transistor 10 so as to cause the transistor 10 to enter the first state.

In parallel, the method comprises a step 140 for the measurement, by the measuring unit 16, of the evolution over time of the control voltage $V_{GE}$ of the transistor 10. The measurements are then communicated by the measuring unit 16 to the processing unit 20.

The measuring step 140 is implemented or carried out before the powering on of the transistor 10, i.e., before the applied voltage is greater than or equal to the previously defined threshold voltage.

"Measure" refers to obtaining a value directly by a measuring instrument, such as a voltmeter. "Determine" refers to deducing a value, for example, by calculating or using calibration tables, but not directly by a measuring instrument.

The method next comprises a determining step 150 during which the output voltage $V_{CE}$ of the transistor 10 is determined from the measured control voltage $V_{GE}$.

According to one particular embodiment, the determining step 150 comprises determining, from the first calibration table and the measured control voltage $V_{GE}$, the duration T undergoing the control voltage $V_{GE}$ of said transistor 10 to reach the predetermined threshold voltage value $V_{GE\_S}$. In practice, knowing the control voltage $V_{GE}$ of the transistor 10, the first calibration table of FIG. 3 makes it possible to rise directly to the desired duration T.

The determining step 150 further comprises determining, from the determined duration T and the second calibration table, the output voltage $V_{CE}$ of the transistor 10. In practice, the second calibration table illustrated in FIG. 5 makes it possible to rise directly, knowing the determined duration T, to the output voltage $V_{CE}$ of the transistor 10.

According to one particular embodiment, the method also comprises a step 160 for powering off the transistor 10, i.e., placing the transistor 10 in the off state, with a determined setpoint as a function of the determined output voltage $V_{CE}$. This makes it possible to adapt the switching speed of the transistor 10 based on the determined output voltage $V_{CE}$.

More specifically, the powering off step 160 comprises selecting, based on the determined output voltage $V_{CE}$ and the third calibration table, the second control current profile to be applied between the input electrode G and the second output electrode E of the transistor 10.

Figure 6:
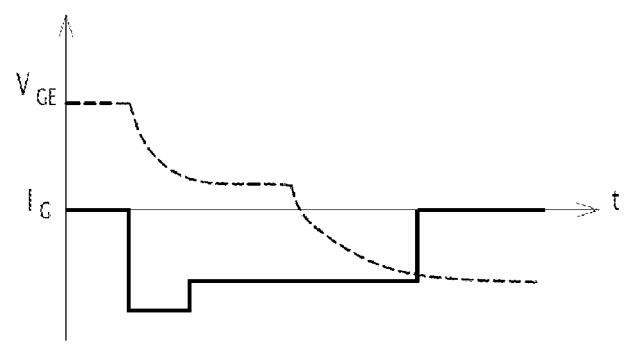

An example second control current profile table is illustrated in FIG. 6. As shown in this FIG. 6, the second control current profile has different plateaus. Each plateau corresponds to a constant value of the current. The plateau with the lowest value is the first plateau, i.e., the plateau applied at the beginning of the injection of the current. Such a second control current profile makes it possible to bring the control voltage $V_{GE}$ of the transistor 10 to a switching voltage as quickly as possible. Next, the plateaus have slightly higher values, which makes it possible to limit the voltage rises and therefore to avoid damaging the transistor 10.

The powering off step 160 next comprises the application of a setpoint in the form of a current having the second determined profile between the input electrode G and the second output electrode E of the transistor 10. The transistor 10 is then powered off.

Thus, the determining method makes it possible to determine, with a simple and low-voltage measuring chain, like a voltmeter, the high-voltage output voltage $V_{CE}$ of a transistor 10.

The control voltage $V_{GE}$ of the transistor 10 being low relative to the output voltage $V_{CE}$ of said transistor 10, the voltage measurement is quick and easy relative to a measurement with a measuring chain dedicated to high voltages. Indeed, in this determining method, only a measurement of the control voltage of the transistor 10 is done, and no other measurement is next done.

The determining device is also more compact and easier to use. It is adaptable to all transistors of an energy conversion system, for example.

Furthermore, the determining device 12 is simple, since said device 12 comprises only a measuring unit 16, a current injector 18 and a processing unit 20. The number of components involved to obtain the output voltage $V_{CE}$ of the transistor 10 is therefore reduced relative to a measuring chain of the state of the art dedicated to high voltages.

The use of a current injector 18 in the form of a current source makes it possible to impose a constant current during the phase for measuring the control voltage $V_{GE}$ of the transistor 10. This makes it possible to limit the current variations, and thus to make the relationship linear between the output voltage $V_{CE}$ and the duration T used by the control voltage $V_{GE}$ of the transistor 10 to reach the predetermined threshold voltage value $V_{GE\_S}$.

Thus, the voltage measurement is very easy to carry out, unlike the solutions of the state of the art, which incorporate a direct measuring chain of the output voltage $V_{CE}$, which is relatively complete and complex.

The output voltage $V_{CE}$ thus determined can then be used to decrease the switching losses and switch the transistor 10 with parameters that will reduce the switching losses as described during the powering off step 160.

Alternatively, the output voltage $V_{CE}$ of the transistor 10 could be used for varied applications, in particular to monitor the failure of the transistor 10 or in applications in which the transistor 10 is used for sensors.

In the present application, the person skilled in the art will understand that the terms "suitable for" and "configured to" are synonymous.

The invention claimed is:

1. A method for determining a bus voltage provided on a bus of an energy conversion system, the energy conversion system comprising a transistor connected to terminals of the bus, the transistor comprising an input electrode, a first output electrode and a second output electrode, the transistor comprising two states including a first state in which the transistor is on and a second state in which the transistor is off, and a potential of the first output electrode being higher than a potential of the second output electrode, the transistor having an output voltage which is the difference in potential between the first output electrode and the second output electrode, the method comprising:
   measuring an evolution over time of a control voltage of the transistor, the control voltage being the difference in potential between the input electrode and the second output electrode, wherein only the control voltage is measured during the measuring,
   determining an output voltage of the transistor from the measured control voltage, the output voltage enabling obtaining of the provided bus voltage, and
   placing the transistor in the second state with a setpoint determined based on the determined bus voltage obtained from the output voltage of said transistor.

2. The method according to claim 1, the measuring being carried out while the transistor is in the second state.

3. The method according to claim 1, wherein a voltage ratio of the transistor is greater than or equal to 50, the voltage ratio being the absolute value of the ratio between the output voltage of the transistor and the control voltage of said transistor.

4. The method according to claim 1, wherein the transistor is an insulated gate bipolar transistor or a unipolar transistor.

5. The method according to claim 1, wherein the method further comprises:
   providing a first calibration table prepared from a calibration transistor, the calibration transistor comprising an input electrode, a first output electrode and a second output electrode, a potential of the first output electrode of the calibration transistor being higher than a potential of the second output electrode of said calibration transistor, the first calibration table representing an evolution of the control voltage of the calibration transistor as a function of time for different output voltages of said calibration transistor and, when a current with a same first predetermined profile is applied between the input electrode and the second output electrode of said calibration transistor, the control voltage of the calibration transistor being the difference in potential between the input electrode and the second output electrode of the calibration transistor, the output voltage of the calibration transistor being the difference in potential between the first output electrode and the second output electrode of the calibration transistor, providing a second calibration table representing an evolution of the output voltage of the calibration transistor as a function of the duration undergoing the control voltage of said calibration transistor to reach a predetermined threshold voltage value from the time where the current having the first predetermined profile is applied between the input electrode and the second output electrode of the calibration transistor, and applying a current having the first predetermined profile between the input electrode and the second output electrode of the transistor, the measuring being carried out at the same time as the applying, and the determining further comprising (i) determining, from the first calibration table and the measured control voltage of the transistor, the duration undergoing the control voltage of the transistor to reach the predetermined threshold voltage value, and (ii) determining, from the determined duration and the second calibration table, the output voltage of the transistor.

6. The method according to claim 5, wherein the method further comprises providing a third calibration table, the third calibration table associating a second control current profile for each output voltage value of the calibration transistor, the placing the transistor in the second state further comprising selection of one of the second control current profiles as a function of the determined output voltage of the transistor and of the third calibration table, and applying a control current having the second selected profile between the input electrode and the second output electrode of the transistor, the second selected current profile being able to place the transistor in the second state.

7. A device for determining a bus voltage provided on a bus of an energy conversion system, the energy conversion system comprising a transistor connected to terminals of the bus, the transistor comprising an input electrode, a first output electrode and a second output electrode, the transistor comprises two states including a first state in which the transistor is on and a second state in which the transistor is off, and a potential of the first output electrode being higher than a potential of the second output electrode, the transistor having an output voltage which is the difference in potential between the first output electrode and the second output electrode, the device comprising:

a voltmeter for measuring the evolution over time of a control voltage of the transistor, the control voltage being the difference in potential between the input electrode and the second output electrode, wherein only the control voltage is measured during the measuring, and a processor and memory for (i) determining an output voltage of the transistor from the measured control voltage, the output voltage enabling obtaining of the provided bus voltage, and for (ii) placing the transistor in the second state with a setpoint determined based on the determined bus voltage obtained from the output voltage of said transistor.

8. An energy conversion system comprising at least one transistor and a device according to claim 7 associated with said transistor.

* * * * *